United States Patent
Way et al.

(10) Patent No.: US 8,623,121 B2
(45) Date of Patent: Jan. 7, 2014

(54) STABLE CATALYST LAYERS FOR HYDROGEN PERMEABLE COMPOSITE MEMBRANES

(75) Inventors: J. Douglas Way, Boulder, CO (US); Colin A. Wolden, Denver, CO (US)

(73) Assignee: Colorado School of Mines, Golden, CO (US)

( * ) Notice: Subject to any disclaimer, the term of this patent is extended or adjusted under 35 U.S.C. 154(b) by 333 days.

(21) Appl. No.: 13/069,050

(22) Filed: Mar. 22, 2011

(65) Prior Publication Data

US 2011/0229379 A1    Sep. 22, 2011

Related U.S. Application Data

(60) Provisional application No. 61/316,142, filed on Mar. 22, 2010.

(51) Int. Cl.
*B01D 53/22*   (2006.01)
*B01D 71/02*   (2006.01)
*C23C 14/34*   (2006.01)
*C23C 16/50*   (2006.01)

(52) U.S. Cl.
USPC .............. 95/55; 95/45; 95/56; 96/4; 96/11; 422/211; 427/569; 427/585; 204/192.1

(58) Field of Classification Search
USPC ................. 96/4, 11; 95/45, 55, 56; 422/211; 427/243, 532, 569, 585; 204/192.1
See application file for complete search history.

(56) References Cited

U.S. PATENT DOCUMENTS

| | | | |
|---|---|---|---|
| 3,350,846 A | 11/1967 | Makrides et al. | |
| 4,865,630 A * | 9/1989 | Abe | 96/11 |
| 5,215,729 A | 6/1993 | Buxabaum | |
| 5,393,325 A * | 2/1995 | Edlund | 95/56 |
| 5,738,708 A | 4/1998 | Peachey et al. | |
| 7,163,670 B2 * | 1/2007 | Agarwal | 96/11 |
| 2008/0174040 A1* | 7/2008 | Saukaitis et al. | 96/11 |

OTHER PUBLICATIONS

Oyama, S.T., "Preparation and Catalytic Properties of Transition Metal Carbides and Nitrides", Catalysis Today, 1992, vol. 15, pp. 179-200.*
Afanasiev "Synthetic approaches to the molybdenum sulfide materials," Comptes Rendus Chimie, Jan.-Feb. 2008, vol. 11, No. 1-2, pp. 159-182.
Dolan et al. "Composition and operation of hydrogen-selective amorphous alloy membranes." Jounral of Membrane Science, Nov. 15, 2006, vol. 285, No. 1-2, pp. 30-55.
Hatano et al. "Improvement in high temperature stability of Pd coating on Nb by Nb2C intermediate layer." International Journal of Hydrogen Energy, Apr. 2007, vol. 32, No. 5, pp. 615-619.
Lee et al. "Molybdenum carbide catalysts: I. Synthesis of unsupported powders," Journal of Catalysis, Jul. 1987, vol. 106, No. 1, 125-133.

(Continued)

*Primary Examiner* — Jason M Greene
(74) *Attorney, Agent, or Firm* — Sheridan Ross P.C.

(57) ABSTRACT

The present invention provides a hydrogen separation membrane based on nanoporous, composite metal carbide or metal sulfide coated membranes capable of high flux and permselectivity for hydrogen without platinum group metals. The present invention is capable of being operated over a broad temperature range, including at elevated temperatures, while maintaining hydrogen selectivity.

28 Claims, 12 Drawing Sheets

(56) References Cited

OTHER PUBLICATIONS

Mundschau "Hydrogen Separation Using Dense Composite Membranes: Part 1 Fundamentals," Inorganic Membranes for Energy and Environmental Applications, Chapter 8, A.C. Bose (ed), 2009, pp. 125-153.

Nishimura et al. V-Ni allowy membranes for hydrogen purification. Journal of Alloys and Compounds, Jan. 17, 2002, vol. 330-332, pp. 902-906.

Oyama "Preparation and catalytic properties of transition metal carbides and nitrides." Catalysis Today, Jun. 30, 1992, vol. 15, No. 2, pp. 179-200.

Patt et al. "Molybdenum carbide catalysts for water-gas shift." Catalysis Letters, Apr. 2000, vol. 65, No. 4, pp. 193-195.

\* cited by examiner

STABLE CATALYST LAYERS FOR HYDROGEN PERMEABLE COMPOSITE MEMBRANES

CROSS REFERENCE TO RELATED APPLICATION

This application claims priority under 35 U.S.C. §119(e) to U.S. Provisional Patent Application Ser. No. 61/316,142 filed Mar. 22, 2010, which is incorporated herein in its entirety by reference.

STATEMENT OF GOVERNMENT INTEREST

This invention was made with government support under grant number DE-FE0001009 awarded by the Department of Energy through NETL. The Government has certain rights in the invention.

FIELD OF THE INVENTION

The present invention provides a hydrogen separation membrane based on nanoporous, composite metal carbide or metal sulfide coated membranes capable of high flux and permselectivity for hydrogen. The present invention is capable of being operated over a broad temperature range, including at elevated temperatures, while maintaining hydrogen selectivity.

BACKGROUND OF THE INVENTION

Approximately 80% of the global energy demand comes from fossil fuels, including coal, petroleum, and natural gas, and this reliance on fossil fuels is expected to increase. The combustion of fossil fuels produces $CO_2$, which may continue to effect climate change. As a result, a number of strategies are being explored to efficiently separate and store $CO_2$ in large stationary sources, such as fossil fuel based power plants, which produce over 50% of the electricity in the U.S., rather than in mobile platforms, i.e. automobiles. For example, coal can be gasified to produce synthesis gas containing mostly carbon monoxide, steam, $O_2$, $N_2$ and hydrogen. This synthesis gas can be sent to a water gas shift (WGS) reactor to convert carbon monoxide and steam to carbon dioxide and hydrogen. The hydrogen can then be separated using a hydrogen separation membrane, leaving the non-permeating $CO_2$ product at pressure or using the hydrogen and $CO_2$ for other processes. The hydrogen separation technique could be applied to many other processes including steam reformed natural gas, ammonia purge gas streams, methanol or other fuels and chemicals from synthesis gas, refinery off-gas streams, and fuel-cell power systems for transportation.

Global production of $H_2$ stands at about 50 million tons/year, and is increasing due to continued expansion of hydrocracking operations required by low grade fuels such as tar sands. Over 95% of $H_2$ is derived from fossil fuels such as natural gas or coal through processes such as steam reforming that yield the following overall reactions:

$$CH_4 + 2H_2O \rightarrow 4H_2 + CO_2 \quad (1)$$

$$C_{(s)} + 2H_2O \rightarrow 2H_2 + CO_2 \quad (2)$$

These processes proceed through CO as an intermediate, and overall conversion is limited by the equilibrium nature of the WGS reaction:

$$H_2O + CO \leftrightarrows H_2 + CO_2 \quad (3)$$

High temperature, inorganic membrane technology is currently being investigated to perform many of the separations needed for co-generation of electric power or hydrogen from fossil fuels while simultaneously concentrating and capturing $CO_2$. However, the current lack of economical separation technology for these high temperature applications makes $H_2$ recovery unfeasible.

A method for making perfectly selective metallic membranes that are permeable to hydrogen using a palladium catalyst layer on both sides of a hydrogen permeable metal or metal alloy substrate from Group VI and Group V of the Periodic Table including vanadium, niobium and tantalum, is generally known in the art. The palladium catalyst layer allows Group VI and Group V metal membranes to be used as hydrogen separation membranes. However, at temperatures above 350° C., the palladium catalyst layer diffuses into the metal membrane and the hydrogen permeability performance decreases dramatically. Furthermore, there is a high cost associated with applying and using the palladium and palladium alloy catalysts.

Thus, there is a significant need in the energy industry and other related fields to provide an economical membrane that is permeable to hydrogen over a broad temperature range and process to purify hydrogen from contaminants as well as other compounds.

SUMMARY OF THE INVENTION

The present invention discloses the potential of molybdenum carbide to serve as stable catalysts for $H_2$ dissociation in high temperature membrane applications. The catalytic properties of transition metal carbides, particularly those of tungsten and molybdenum, were recognized in pioneering work by Boudart's group as discussed in J. S. Lee, S. T. Oyama, M. Boudart, *J. Catal.,* 1987, 106, 125 and incorporated by reference herein. These carbides and analogous sulfides have been pursued as substitutes for precious-metal catalysts in reactions requiring hydrogen oxidation/dissociation, such as in fuel cells or WGS reactors. Although they are not necessarily intrinsically hydrogen permeable, dissociated hydrogen readily diffuses along their surfaces. The thin layers of carbides may allow for the transport of dissociated hydrogen to the underlying metal along grain boundaries or micro-scaled defects. The carbides are non-metallic, mechanically durable, and have extremely highly melting points, all of which should make them less prone to alloying with the base metal and enable stable operation at high temperature. The proposed carbide/metal composites contain no platinum group or platinum group metals, which reduces material and process costs by orders of magnitude relative to Pd-based systems.

One aspect of the present invention will optimize the performance of novel, high temperature, surface diffusion membranes based on metal (for example, Molybdenum or Tungsten) carbides, sulfides, nitrides, bi or multiple layers of the catalysts and alloys catalysts. The hydrogen chemically adsorbs on the metal carbide, sulfide and nitride layers, and diffuses through the pores on the catalyst surface. In one aspect of the invention, these membranes contain no platinum group metals (PGMs) such as ruthenium, rhodium, palladium, osmium, iridium or platinum.

It is a further aspect of the present invention to provide a hydrogen permeable membrane that is operable over broad temperature ranges, including elevated temperatures. These temperatures are typically between about 200° C. and about 600° C.

It is another aspect of the present invention to provide the metal carbide, sulfide or nitride, or combinations thereof, catalyst layer to various crystalline or amorphous metals or alloy substrates of various geometric configurations. In certain embodiments, these geometric configurations may include tubular, planar, non-planar and hollow fibers. In other embodiments the substrate is a body center cubic metal foil.

It is another aspect of the present invention to provide a transition metal carbide catalyst layer on dense metals from Transition Metal Groups III, IV, V and VI, including but not limited to vanadium, tantalum, niobium, and manganese. Once the metal carbide catalyst layer dissociates the hydrogen, the atomic hydrogen can diffuse through the body centered cubic (BCC) phase dense metal. The metal catalyst layer is essential for dissociating molecular hydrogen to atomic hydrogen without the use of platinum group metals.

It is a further aspect of the invention to repair pores larger than about 3 nm in the metal carbide coating.

It is a further aspect of the present invention to provide a method for applying the metal carbide, nitride or sulfide catalyst layer to the substrate. In one embodiment of the invention, the catalyst layer can be attached to the substrate using chemical vapor deposition, including RF sputtering. More particularly, the method for chemical vapor deposition can be plasma enhanced chemical vapor deposition (PECVD). Another aspect of the invention applies and tailors the final pore size of the metal carbide catalyst using atomic layer deposition (ALD) and/or pulsed PECVD. Alternatively, the metal carbide catalyst can be adhered to the substrate by physical deposition or sputtering. The metal carbide catalyst can also be applied using conventional powder processing and creating a slurry of the precursor metal oxide, which can be applied to the substrate by a variety of application methods. In other embodiments, the catalyst layer may be formed through deposition of an oxide and its subsequent conversion to a carbide, nitride or sulfide layer. In still other embodiments, the carbide, nitride or sulfide layer can be applied directly to the substrate. In still other embodiments, a combination of the conversion of an oxide layer to a carbide, nitride and sulfide layer can be used in combination with directly applying a carbide, nitride or sulfide directly to the surface of the substrate. In still other embodiments, carbide, nitride or sulfide (or combinations thereof) layers are applied to both sides of the substrate.

DETAILED DESCRIPTION

The present invention relates to a hydrogen separation membrane that does not require a platinum group metal catalyst. The present invention provides a hydrogen selective membrane that is effective over a broad temperature range, including elevated temperatures, without poisoning the membrane. These hydrogen selective membranes can be very effective chemical reactors for reactions where hydrogen is a product. Examples of such uses includes, but is not limited to, use with ammonia decomposition or the WGS reaction. Removal of the hydrogen product allows the reactor to operate in a non-equilibrium mode, and conversions can exceed the equilibrium value. In the case of the WGS reaction, performing this reaction in a membrane reactor can produce both pure hydrogen and concentrated $CO_2$ product streams.

Figure 1:
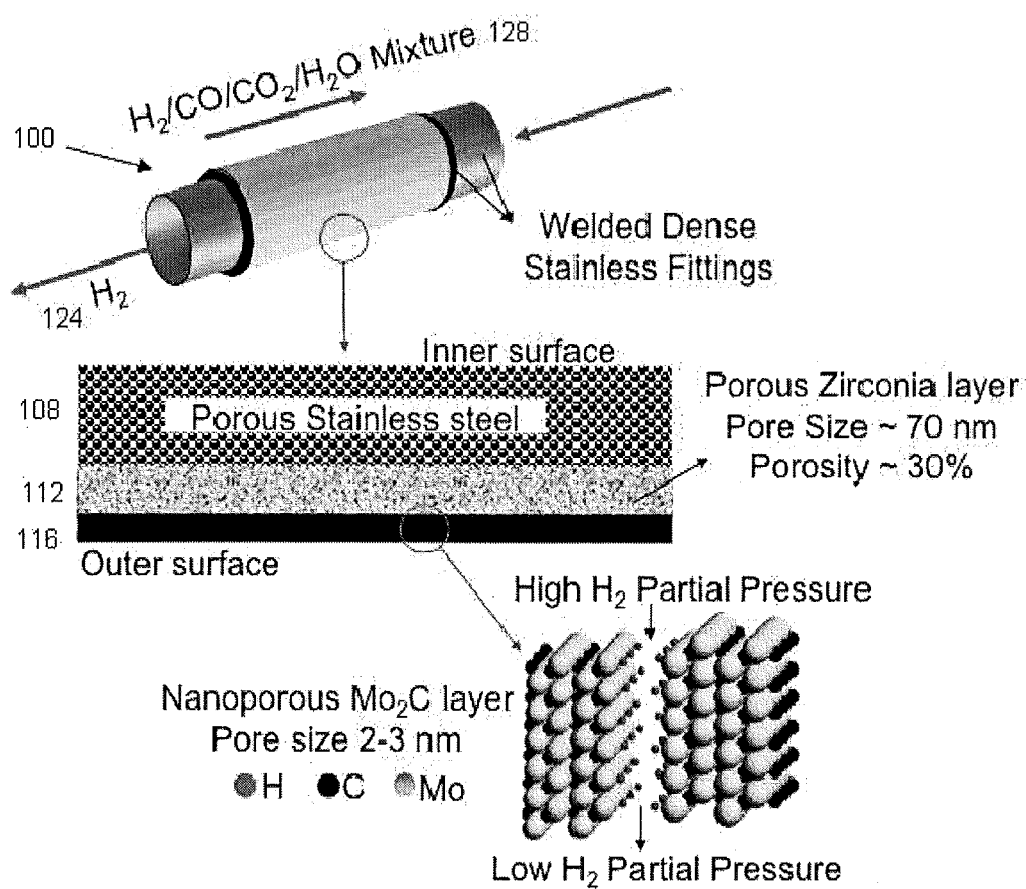
FIG. 1 illustrates a general overview of a molybdenum carbide composite membrane.

Referring to FIG. 1, a general overview of the molybdenum carbide composite membrane 100 for use with hydrogen separation is shown. The catalyst layer 116, here depicted as $Mo_2C$, coats the porous zirconia layer 112 of a porous stainless steel substrate 108. A gaseous mixture 128, including $H_2$, enters the membrane 100. While the $H_2$ 124 is able to permeate through the membrane 100, the remaining gaseous mixture 128, is not able to permeate through the membrane.

Figure 2:
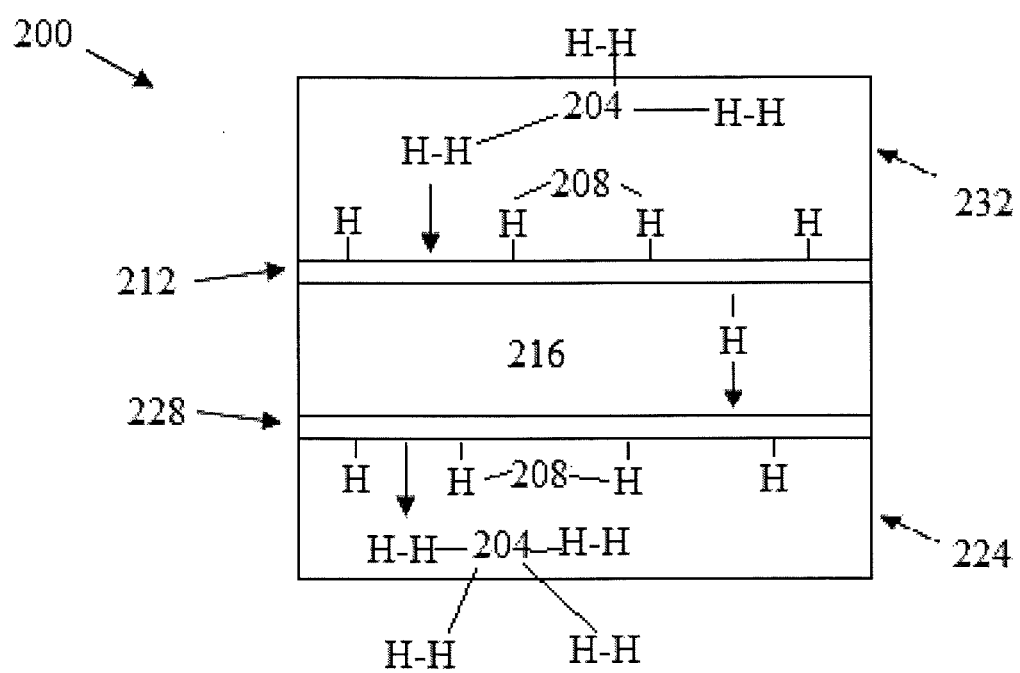
FIG. 2 illustrates a general overview of a BCC substrate with catalyst layers.

FIG. 2 illustrates an embodiment of a catalyst composite membrane 200. The substrate 216 is coated on both sides with catalyst layers 212 and 228. The catalyst layers 212 and 228 may be the same catalyst or they may be different catalysts. In some embodiments, catalyst layer 212 may be a metal carbide, metal nitride or metal sulfide catalyst layer. In some embodiments, multiple layers of a metal carbide, metal nitride or metal sulfide catalyst layer are used to comprise catalyst layer 212. In some embodiments, catalyst layer 228 may be a metal carbide, metal nitride or metal sulfide catalyst layer and in some embodiments catalyst layer 228 may comprise multiple layers of a metal carbide, metal nitride or metal sulfide. The catalyst layers 212 and 228 are generally nanostructured and are about 2 to about 50 nanometers thick. The substrate 216 is a BCC foil. The substrate 216 material may be any BCC structured material, including but not limited to dense metal substrates from Groups III, IV, V and VI. Non-limiting examples of these substrate metals may include vanadium, niobium and tantalum and alloys thereof. In some embodiments, the substrate 216 material is a BCC foil. The substrate 216 is less than about 1 to about 75 μm thick. Hydrogen gas 204 present on one side of the catalyst composite membrane 200 and dissociate to atomic hydrogen 208, permeates through the catalyst layer 212 and substrate layer 216. Optional porous layer 224 may also be included in embodiments of the present invention. The atomic hydrogen 208 recobines on the surface of the catalyst layer 228 and desorbs as molecular hydrogen gas 204, which is then transported through the porous layer 224. Optional porous layer 232 may also be present above catalyst layer 212. In some embodiments, only one porous layer 224 is used. Porous layers 224 and 232 may be the same porous material or they may be different porous materials. The porous layers 224 and 232 may include but is not limited to alumina, silica, zirconia, ceria, titania and the like.

The present invention uses a metal catalyst layer, such as a transition metal carbide, transition metal nitride or transition metal sulfide catalyst on a substrate. Though metal carbide is used throughout the specification, it should be understood that a metal carbide or a metal sulfide catalyst may be used as the catalyst layer. It is an object of the present invention to apply the metal carbide to the substrate in a number of different ways. The metal carbide catalyst layer allows the hydrogen to permeate through the substrate, but unlike platinum group metals, the metal carbide catalyst layer does not poison the substrate when used at elevated temperatures. Rather, the present invention improves the temperature range of use of the hydrogen separation membrane. Metal carbide, including $Mo_2C$, facilitates surface diffusion of hydrogen that is thermally activated up to about 600° C. while maintaining hydrogen permutation at elevated temperatures.

Several materials have been identified as possible substrates for the present invention. Various porous, inorganic crystalline or amorphous metals or alloy substrates may be used with the present invention. For example, SAE grade stainless steel may be used with the present invention. Additionally, porous stainless steel substrates, including AccuSep™ porous stainless steel filter media from Pall Corporation, may be used with the present invention. Other non-limiting examples of substrates may include nickel, including nickel alloys, such as Hastelloy or Inconel. Furthermore, the substrates may be coated with a porous oxide coatings, including but not limited to alumina, silica, zirconia, ceria, titania and the like. In other embodiments, the substrates are coated directly with the metal carbide catalyst layer.

Alternatively, alumina substrates may be used with the present invention, such as Anopore™ inorganic substrates. These substrates may also be coated with a porous oxide coating. In other embodiments, the substrates are coated directly with the metal carbide catalyst layer.

It is another aspect of the present invention to apply the transition metal carbides, nitrides, and sulfides on dense metals from Groups III-IV. Non-limiting examples include vanadium, tantalum, and niobium. Once the metal catalyst layer dissociates the hydrogen, the atomic hydrogen can diffuse through the body centered cubic phase dense metal. The metal catalyst layer is essential for dissociating molecular hydrogen to atomic hydrogen. These substrates may be coated with an oxide coating, then converted to a metal carbide catalyst layer or the substrates are coated directly with the metal carbide catalyst layer.

The substrates may be any geometric configuration. For example, the substrates may be tubular, planar, non-planar or hollow fibers.

The present invention also discloses a method to identify and repair large pores in the substrate to eliminate non-selective transport by viscous flow. In order to achieve selectivity, larger pores that allow transport by viscous flow need to be minimized.

Another aspect of the present invention is a method to determine if a repair of the substrate is necessary. An initial permeation test may be performed with an inert gas, including $N_2$. If the permeance of the inert gas is constant over a range of feed pressures, then a repair of the substrate will not be necessary because only selective transport mechanisms are occurring. Testing can also be performed at various temperature ranges. Pure gas permeation rates with the inert gases may be measured for a range of pressure differentials (about 5 psi to about 170 psi) and temperatures ranging from about 200° C. to about 700° C. on membranes considered free of large defects based on the preliminary $N_2$ permeance analysis. Ideal separation factors will be computed as ratios of gas permeances (flux/$\Delta P$). Permeance and ideal separation factors may be compared to literature studies and flux targets to select acceptable substrates. If, however, the inert gas permeance is not constant over a range of feed pressures, the selective transport mechanisms are not occurring and repair techniques may be necessary.

The present invention provides a method to repair a substrate if the selective transport mechanisms are not occurring. Prior to the deposition of the metal oxide layer, a removable polymer template (ethyl cellulose, a polyimide, or a similar glassy polymer) is used to fill the pores in the top layer of the substrate. The polymer template fills in the pore space and smoothes out the surface roughness. The polymer template may be applied by to the entire surface of the substrate or localized to specific locations by any suitable means. For example, the glassy polymer may be used to fill the pores of the zirconia top layer of an AccuSep™ filter. Filling the pores creates a relatively smooth surface for the deposition of the metal oxide film. The polymer template used to repair the substrate, which fills the pore structure of the substrate and acts as a template prior to the deposition of the catalyst layer, is chosen depending upon the optimum metal oxide deposition layer of the catalyst precursor. In a preferred embodiment, the glassy polymer solution is about 15% ethyl cellulose in acetone. Ethyl cellulose has a high glass transition temperature of about 133° C. and is an excellent film former. If the optimum metal oxide deposition temperature is higher than about 120° C., a higher glass transition polymer such as a polyimide will be used as a template. The pores on the substrate are coated with enough of the glassy polymer to fill up the pores at the surface of the substrate. After the coating is applied to fill the pores at the surface of the substrate, inert gas can be used to determine if the glassy polymer has filled the holes, thereby decreasing the inert gas flow through the substrate coated with the template. The polymer layer will stay intact but may be removed by combustion in air at a suitable temperature after deposition of the oxide coating, which may be measured using Thermal Gravimetric Analysis. For example, if ethyl cellulose in acetone is used as the glassy polymer template, then it may be removed by oxidation in air at about 400° C. Other polymeric templates that can withstand higher temperatures, such as a polyimide such as Vespel™ by DuPont for example, will require a higher oxidation temperature to remove the template.

Alternatively, an inorganic template such as aluminum or cerium hydroxide can be used. An inorganic template may be preferable if the oxide layer is applied at elevated temperatures, greater than about 400° C. for example. These application temperatures prohibit the use of some polymer templates that cannot withstand these elevated temperatures. The inorganic template can be in any suitable form, including a gel. Similar to the polymeric template, the inorganic template fills the pores of the substrate. After the coating is applied to fill the pores on the surface of the substrate, inert gas can be used to determine if the inorganic template has filled the holes, thereby decreasing the inert gas flow through the coated substrate. The membrane is formed on top of the inorganic template layer. The template is removed by heating in an oxidizing atmosphere where the hydroxide is converted to an oxide.

After either the polymeric template or the inorganic template is removed, the metal oxide layer remains on the substrate, which can then converted to a carbide layer.

Once a substrate is chosen, and preprocessing is completed if it was found to be necessary, the catalyst layer may be applied. Group VI transition metals carbides, nitrides and sulfides, including molybdenum and tungsten, have platinum-group-like catalytic and adsorption properties. Additionally, molybdenum carbide membranes exhibit surface diffusion flow properties similar to those observed with platinum group membranes and the hydrogen binding energy for $Mo_2C$ is similar to platinum and alloys of platinum group metals. It is an object of the present invention to apply a porous (about 5 nm to about 50 nm) Group VI transition metal catalyst layer to a substrate for use in hydrogen separation. These metal catalyst materials are advantageous over platinum group catalysts because they are very thermally stable (melting points exceeding about 2000° C.) and chemically stable over a wide range of conditions. (e.g. the carbide materials can be used to catalyze the WGS reaction, hydrodesulfurization, hydrocarbon reforming, etc.). The hydrogen chemically adsorbs on these metal catalysts, and diffuses through the pores on the surface of the membrane.

Though molybdenum and tungsten carbide catalyst layers and compounds are discussed in detail throughout the specification, it should be understood that the present invention will be applicable to the all of the Group VI transition metals and their alloys. Furthermore, the present invention would be applicable for transition metal nitride and sulfide layers as well.

Transition metal disulfides, e.g. $MoS_2$, $WS_2$, have been shown to display similar catalytic activity to the metal carbides discussed above. Transition metal sulfides are advantageous for hydrogen selectivity because these materials are inherently resistant to sulfur poisoning and will require sulfur in the gas phase to stay in the sulfide form. Transition metal nitrides are also a feasible option for the catalyst layer.

It is an object of this invention to apply a metal carbide catalyst layer to the substrate. The application of the metal carbide catalyst to the substrate of the present invention can occur in several different ways. The metal carbide catalyst can be applied using RF sputtering for example. A novel application of the present invention utilizes plasma enhanced chemical vapor deposition (PECVD) for the synthesis of transition metal oxides, including the metal oxide precursor to the metal carbide catalyst layer of the present invention. In general, the PECVD applies a precursor to the surface of the substrate, then converts the precursor to metal carbide. The PECVD approach is advantageous because it delivers very smooth films at high deposition rates (generally, greater than about 100 nm/min) at room temperature. Additionally, since the PECVD process occurs at low temperatures, typically less than about 150° C., a polymer template may be used rather than an inorganic template to repair damaged pores in the substrate or as a template material to smooth out the surface of the substrate material prior to application of the metal oxide precursor layer.

In another aspect of the present invention, the PECVD is pulsed to behave as a self-limiting growth process (i.e. about 1 Å/pulse). The pulsed PECVD of the present invention allows final pore size tailoring in the metal carbide layer of the supported substrate.

The metal catalyst layer may be applied directly to the substrate. Physical deposition of the metal catalyst layer may be deposited over a large temperature range, for example from room temperature (approximately 25° C.) to about 600° C. The substrates may be heated to their respective application temperatures and the carbide catalyst may be applied. In some embodiments, the substrate may be heated to its application temperature under vacuum and the catalyst layer may be applied.

As explained above, a chemical precursor can be used during vapor phase deposition of a transition metal oxide, carbide and/or sulfide. For both molybdenum and tungsten, there are two preferred precursors: metal carbonyls or metal halides. It one embodiment of the present invention, the precursor is a vapor at ambient conditions. Thus, the metal oxide, which acts as a co-reagent, can be applied at room temperature. Other aspects of the present invention utilize precursors that are solids at room temperature. During these conditions, the solids and vapors are introduced by sublimation into a carrier gas, which may include helium, nitrogen, argon, hydrogen and air. The reactor and/or substrate temperature must be greater than the source temperature in order to prevent precursor condensation in the reactor. The oxidizer in all cases will be $O_2$, while $H_2$ is often supplied when using the halide precursors to scavenge the ligands. Table 1 includes examples of different precursors that may be used during the vapor deposition, though the list is not exclusive.

TABLE 1

Precursors used for the vapor phase deposition of transition metal oxides, carbides, and sulfides.

| Precursor | Phase | Delivery Method | Co-Reagents |
|---|---|---|---|
| $WF_6$ | Gas | Mass Flow Controller | Oxides: $O_2$, $H_2$ |
| $MoF_6$ | Gas | Mass Flow Controller | Oxides: $O_2$, $H_2$ |
| $W(CO)_6$ | Solid | Sublimes ~150° C., B.P. 175° C., Carrier Gas | Carbides: $CH_4$, $C_2H_2$, $C_2H_4$, $H_2$ |
| $Mo(CO)_6$ | Solid | Sublimes ~130° C., B.P. 156° C., Carrier Gas | Sulfides: $H_2S$ |
| $MoCl_5$ | Solid | M.P. 194° C., B.P. 268° C., Carrier gas | |

In a preferred embodiment, $WF_6$ and $MoF_6$ are the precursors for the vapor phase deposition of transition metal oxides, carbides and sulfides. To a first order, the deposition rate of PECVD is first order in precursor density, whereas the $O_2$ flowrate controls the oxidation state of the resulting films. The precursor flowrate can be adjusted to deliver deposition rates, generally greater than about 100 nm/min, and the $O_2$:precursor ratio will be generally greater than about 10 to ensure that the resulting films are fully oxidized.

To coat the substrate, a motorized rotary motion feedthrough may be added to the PECVD reactor, though it is not required. This feedthrough suspends the substrates in the middle of the plasma volume, while continuously rotating them to ensure a uniform coating. The feedthrough will be electrically grounded, providing a similar deposition environment as experienced by a planar grounded electrode. In a preferred embodiment, the weld ends of the tubular membranes may readily be attached to a source gas using compression fittings.

Smooth resulting films will be achieved as a result of the present invention. By applying a smooth film, pinholes are eliminated and pore size of the catalyst layer is tightly controlled. The oxides deposited by PECVD are very smooth, with typical RMS roughness values of about 1 nm on smooth substrates (i.e. Si, glass). In one aspect of the invention, an inorganic substrate is used, such as a stainless steel substrate. The nominal pore size on the zirconia coated stainless steel membranes is about 70 nm and a smooth metal carbide catalyst is applied to the substrate. In the event that the smoothness of the porous oxide coated substrate is unsatisfactory, a glassy polymer template will be employed to smooth the surface of the porous oxide coating prior to deposition as described in greater detail above with regard to the substrate. In one aspect of the invention, in order to promote a smooth and even catalyst layer, a film layer can be formed on the surface of the substrate by applying a coat of a glassy polymer template solution. The polymer template will be determined depending on the optimum metal oxide deposition temperature. The porous oxide coating is coated with enough of the glassy polymer template to fill up the pores on the surface. After the coating is applied to fill the pores on the surface of the coating, inert gas can be used to determine if the glassy polymer template has filled the holes, thereby decreasing the inert gas flow through the porous oxide coating. The polymer template will stay intact but may be removed by combustion in air at a suitable temperature after deposition of the oxide coating, which may be measured using Thermal Gravimetric Analysis. In a preferred embodiment, the glassy polymer template solution is ethyl cellulose in acetone.

Since the PECVD synthesis method generally occurs at low temperatures, the polymer layer will stay intact but may be removed by oxidation in air at about 400° C. after deposition of the oxide coating. At this point, the dense metal oxide films, e.g. $MoO_3$, $WO_3$, will be converted to nanoporous, generally about 2 nm≤$d_p$≤about 3 nm metal carbide, e.g. $Mo_2C$, $W_2C$, films using literature temperature programmed reaction (TPR) methods in a hydrocarbon/$H_2$ atmosphere. The TPR conditions necessary to convert the dense metal oxides to nanoporous metal carbides may be optimized using the metal oxide materials previously applied to the substrate and controlling the TPR conditions. The TPR conditions of about 80% $H_2$ in gaseous phase hydrocarbon, for example, a binary mixture of methane, acetylene or butane, at a heating rate of about 0.5° C./min to about 1° C./min with a maximum temperature of about 927° C. Upon reaching the maximum temperature, the substrate will be cooled in pure hydrogen and then passivated in about 1% $O_2$, or other oxidizing gas including carbon dioxide, in a noble or inert gas such as Argon, Nitrogen or Helium for example.

There are several advantages to the above described procedure. For example, because the molar volume of $Mo_2C$ is smaller than the molar volume of $MoO_3$, micropores form as the oxide transforms into the carbide. Also, the $MoO_3$ is converted to $Mo_2C$ without having metallic Mo as a reaction intermediate. Metal sintering is also avoided using this method, and unsupported catalysts can be prepared with very high surface areas (generally, greater than about 100 $m^2/g$), and corresponding pore sizes are below about 3 nm, more preferably between about 1 and about 3 nm. The pore size can be engineered or tailored by modification of the TPR conditions for the production of $Mo_2C$ and the TPR conditions may be monitored and controlled in situ using quadrupole mass spectrometry (QMS). Water is the main byproduct of the reduction process. Monitoring the evolution of the water byproduct provides a measure of both the rate and extent of the carburization process and optimization of the TPR process conditions (heating rate, gas composition, etc.).

In another aspect of the present invention, reactive plasma discharges are used to deposit thin films and modify surface properties of substrates. In these non-equilibrium discharges, electromagnetic energy is selectively delivered to electrons, which in turn are heated to several eV (about 10,000 K-about 50,000 K). However poor elastic coupling between the electrons and the relatively heavy gas molecules allows the latter to remain at ambient conditions. As a result plasma allows activated chemical processes to occur readily at low temperature without impurities.

Another important aspect of PECVD is its high deposition rate; transition metal oxides, such as $WO_3$ and $V_2O_5$, have been deposited at rates generally greater than about 100 nm/min, which is critical for efficient, industrially acceptable, synthesis of the micron-scale layers required in the formation of hydrogen separation membranes.

Figure 3:
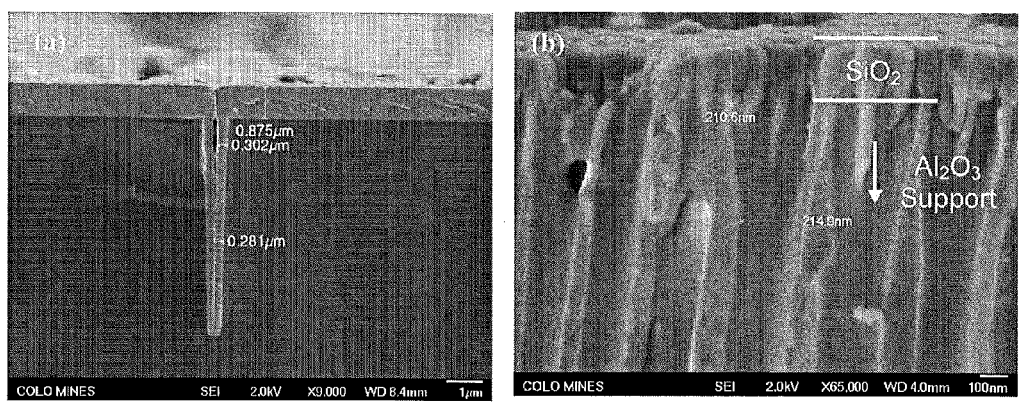
FIG. 3 illustrates SEM images of a substrate coated using pulsed PECVD.

Though atomic layer deposition (ALD) may be used for self-limiting growth, the pulsed PECVD process may also be used as an alternative. The self-limiting nature of pulsed PECVD allows for highly conformal deposition on non-planar substrates. Pulsed PECVD has an advantage over ALD in that this conformal deposition can be achieved at high rates and low temperature and can be tuned depending on the applications. FIG. 3 shows the two extremes that can be obtained. FIG. 3a is a high aspect ratio trench that was completely filled with $Al_2O_3$ using pulsed PECVD. Note that the remaining hole is a reflection of notches in the original trench structure, further confirming the conformal nature of the process. FIG. 3b shows a coating with no conformality, where the substrate is an anodized alumina support (Anopore™) with vertical pores that are nominally about 200 nm in diameter. A dense layer of $SiO_2$ was deposited over the porous structure, with little deposition in the pores themselves. This dynamic range of conformality may be obtained by simply varying the operating conditions of the pulsed PECVD process.

Chemical vapor deposition (CVD) of $MoO_3$, $WO_3$, and mixed transition metal oxides has been accomplished using the same precursors described above in Table I to form the catalyst layer of the membrane. The principal difference is that CVD requires higher temperatures (about 100° C. to about 400° C.), so it may be detrimental to the polymer templates, though an inorganic template material may be used. Alternatively, a polymeric template that may withstand temperatures above about 400° C., may be used.

Another aspect of the present invention applies the metal carbide catalyst layer using a precursor slurry or via chemical bath deposition. The solution comprises the metal oxide, an alcohol, a surfactant and a hydrocarbon binder. The substrate is coated in the metal carbide catalyst by, for example, dipping, spraying, painting, pouring or rolling. The coated substrate is subjected to high temperatures so the metal oxide can be converted to carbide using carburization procedures known in the art. For example, the $MoO_3$ compound can be converted to the sulfide by reacting it with a mixture of $H_2$ and $H_2S$ between about 500° C. and about 650° C. Other synthetic methods for the synthesis of $MoS_2$ from $MoO_3$ are reviewed by P. Afanasiev, Comptes Rendus Chimie., 11 (2008) 159-182, incorporated herein by reference.

In still other aspects of the present invention, the metal catalyst layer may be applied directly to the surface of the substrate or to a porous layer using vapor deposition techniques, including sputtering, CVD, PECVD or by solution growth through use of slurries or chemical bath deposition.

Another aspect of the present invention allows the hydrogen separation membrane be assessed in situ. After deposition of a given amount of material, the integrity of the hydrogen separation membrane can be assessed in situ by supplying an inert gas to the membrane interior and testing the flux as a function of inlet pressure. If the permeance of the inert gas is insensitive to a change in pressure, then the viscous flow is negligible and repair of the membrane is not necessary.

In another aspect of the invention, the membranes are annealed following the deposition of the metal carbide films to create porosity, strength and adhesion between the substrate and the metal carbide catalyst. The metal carbide catalysts can typically be annealed between about 400° C. to about 1000° C.

In another aspect of the invention, the porous metal carbide layers will be functionalized with a thin (about 1 nm) layer of sulfide deposited by PE-ALD and/or pulsed PECVD. This sulfur layer may provide benefits, including the prevention of sulfur poisoning.

The membranes may be used in a variety of applications. For examples, the membrane may be incorporated into a reforming or WGS reactor, the removal of products can drive reactions (1-3) described above toward complete conversion.

The flux of $H_2$ through metal membranes generally follows Sievert's law:

$$J = -D_H K_s (P_{H2,Feed}^{1/2} - P_{H2,Permeate}^{1/2}) \quad (4)$$

where J is the flux of molecular hydrogen, $D_H$ is the diffusion coefficient, $K_s$ is the solubility constant, and $P_{H2}$ is the partial pressure of $H_2$. The square root pressure dependence arises in these systems when the rate of $H_2$ dissociation and recombination on the surfaces is much faster than transport through the bulk. This is the case for all but the thinnest palladium membranes, and for most BCC-metal membranes at temperatures above 400° C. Deviations from Sievert's law are most often observed when the surface is poisoned, and the flux becomes limited by $H_2$ dissociation.

EXAMPLES

Example 1

Thin layers of $Mo_2C$ were applied to both sides of 50 μm thick vanadium substrates by sputtering. All substrates tested had zero detectable flux of helium up to transmembrane pressures of ΔP=690 kPa, which indicates that transport via pinholes is negligible in these structures. A control substrate with no $Mo_2C$ catalyst layers also had no hydrogen flux, with the detection limit being $5.9 \times 10^{-5}$ mol $m^{-2}$ $s^{-1}$ for both He and $H_2$. This demonstrates that the $Mo_2C$ catalyst layer is solely responsible for hydrogen dissociation. All membranes coated with $Mo_2C$ layers displayed detectable hydrogen transport, with the most permeable material to date shown in FIG. 4.

Figure 4:
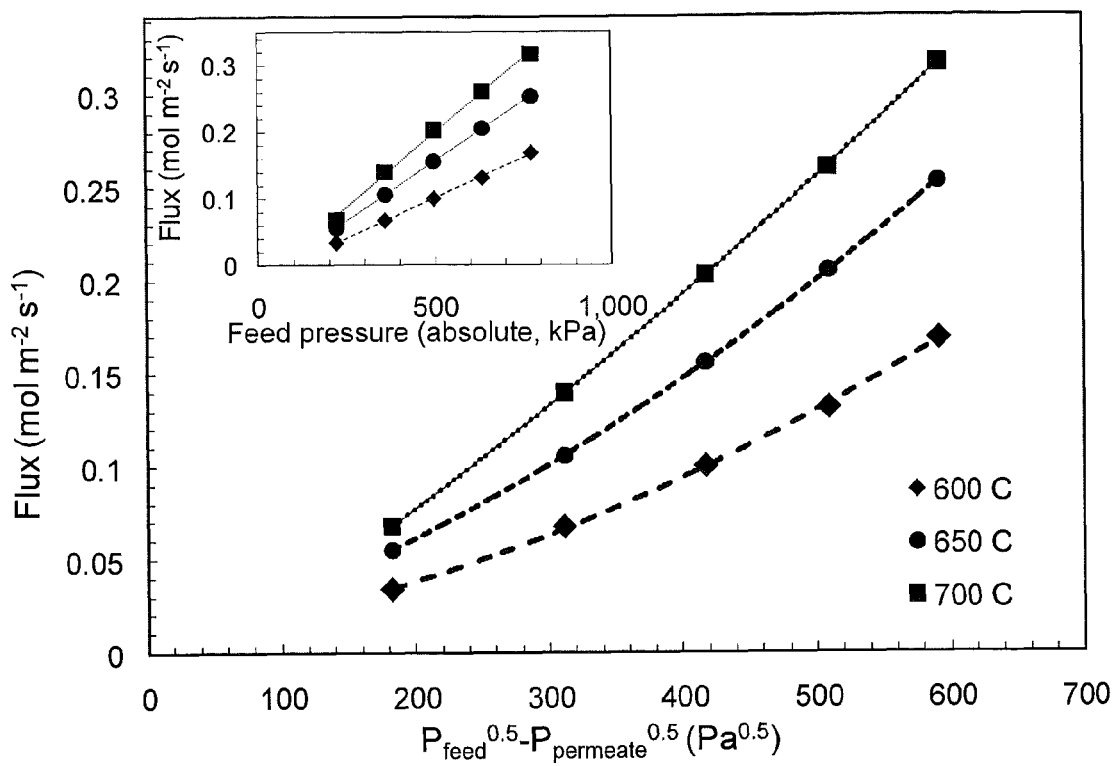
FIG. 4 illustrates the hydrogen flux vs. square root of the partial pressure gradient, inset illustrates flux vs. feed pressure.

The carbide-coated vanadium films showed poor correspondence to Sievert's law, having a linear relationship with pressure, rather than $P^{1/2}$ as shown in FIG. 4. This suggests that the catalyst layer is limiting the rate of hydrogen transport in these membranes, due to the lower activity of $Mo_2C$ compared to materials such as Pd. To further test this argument the structure of the carbide layers were varied by changing the sputtering conditions as explained in Example 2.

Example 2

Figure 5:
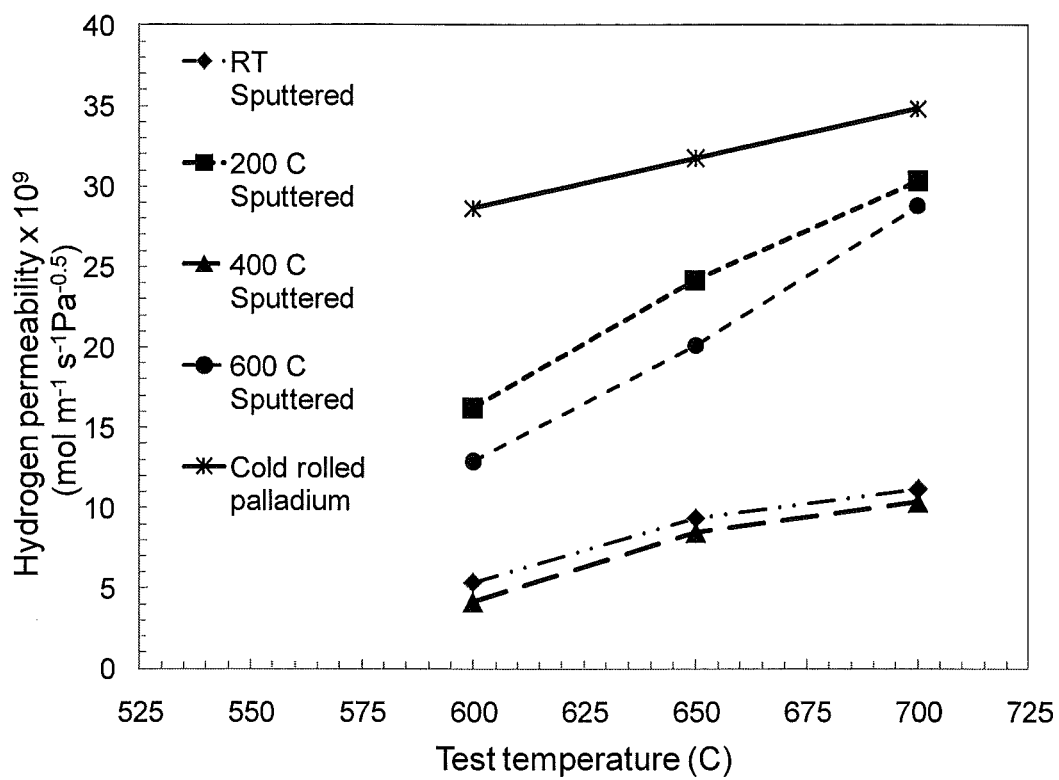
FIG. 5 illustrates hydrogen permeability as a function of application temperature.

FIG. 5 illustrates the hydrogen permeability as a function of temperature for carbide-coated vanadium membranes fabricated at selective temperatures, compared with permeability data for bulk palladium. FIG. 5 compares the temperature dependence of $H_2$ permeability for Pd with four composite carbide membranes whose catalyst layers were deposited at different temperatures. Although all the membranes have permeabilities significantly lower than vanadium's theoretical maximum, the membranes sputtered at about 200° C. and about 600° C. are comparable to permeability of palladium membranes, particularly at higher temperatures. The observed trend of higher permeability with increased temperature provides additional support that the carbide layer limits hydrogen transport, as flux through bulk vanadium drops with temperature due to decreased hydrogen solubility in the lattice.

The $H_2$ separation performance observed in FIG. 5 was correlated with changes in crystal structure and surface morphology of the sputtered carbide.

Example 3

Figure 6:
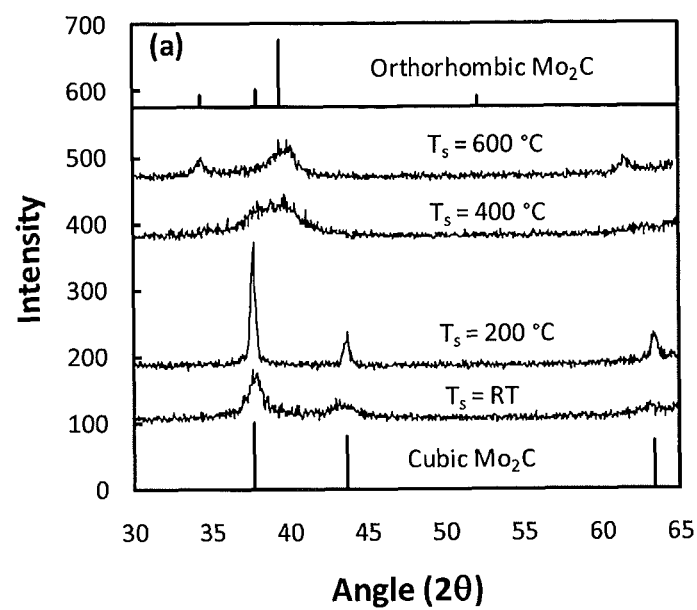
FIG. 6 illustrates x-ray diffraction patterns as a function of application temperature.

FIG. 6 illustrates images demonstrating the effect of temperature on $Mo_2C$ film properties. The properties of as-deposited $Mo_2C$ as a function of sputtering temperature are shown in FIG. 6. The X-ray diffraction (XRD) patterns obtained from as-deposited films as a function of sputtering temperature are compared with literature values in FIG. 6. The film deposited at room temperature (RT), approximately 25° C. displays the cubic phase (JCPDS 15-0457), though the peaks are broad and low-intensity, suggesting that the material is nanocrystalline and/or substantially disordered. Films deposited at about 200° C. retain the cubic structure, but the degree of crystallinity is dramatically improved as evidenced by the increased intensity and reduced width of the diffraction peaks. At about 400° C. the crystalline nature is lost, while a further increase in substrate temperature to about 600° C. suggests that the films begin to adopt the orthorhombic crystal structure (JCPDS 79-0744).

Example 4

Figure 7:
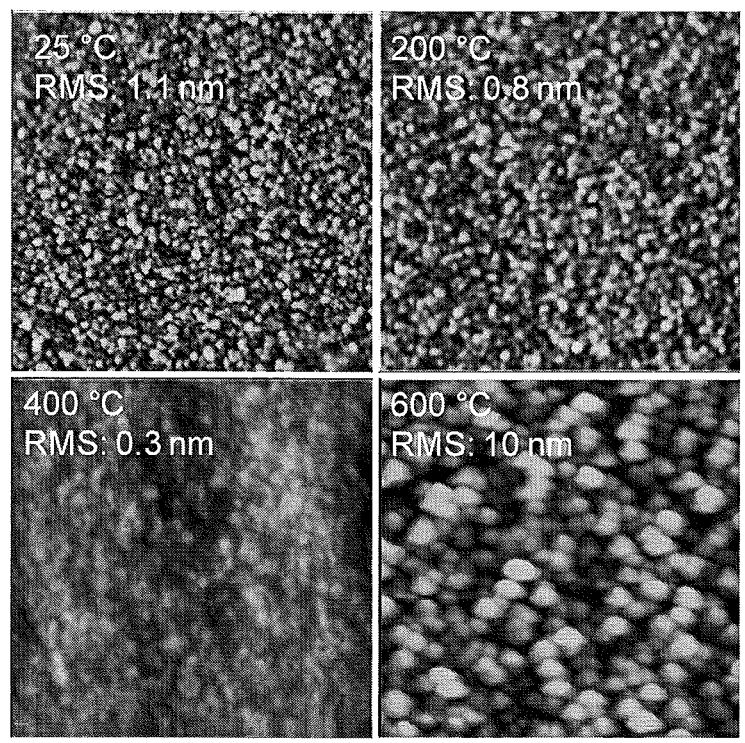
FIG. 7 illustrates RMS roughness as a function of application temperature.

The deposition temperature was also found to have a profound impact on film morphology, as shown by the atomic force microscopy (AFM) images presented in FIG. 7. The films displaying the cubic phase at RT and about 200° C. display a nanocrystalline morphology that is quite smooth, with a root mean square (RMS) roughness of about 1 nm. The surface of the film deposited at about 400° C., which has no discernable crystal structure, is featureless and ultrasmooth. At about 600° C. the appearance of the orthorhombic phase coincides with the return of a nanocrystalline morphology with significantly larger features and a RMS roughness of about 10 nm. The observed evolution of microstructure with substrate temperature is qualitatively consistent with Thornton's zone diagram for sputter-deposited coatings. Comparison of FIG. 5 and FIG. 6 suggest that the carbide morphology plays an important role for $H_2$ transport in this system. The highest permeability was obtained at about 200° C. and about 600° C., which displayed the highest degree of crystallinity and surface structure, respectively. In contrast, the permeance was significantly lower in samples fabricated at RT and about 400° C. which had little discernible crystal structure or surface features. These findings support the hypothesis that grain boundaries play an important role in hydrogen transport through these layers. It is expected that the performance of these systems can be further enhanced by improving the microstructure and/or reducing the thickness of the carbide layers.

Example 5

Figure 8:
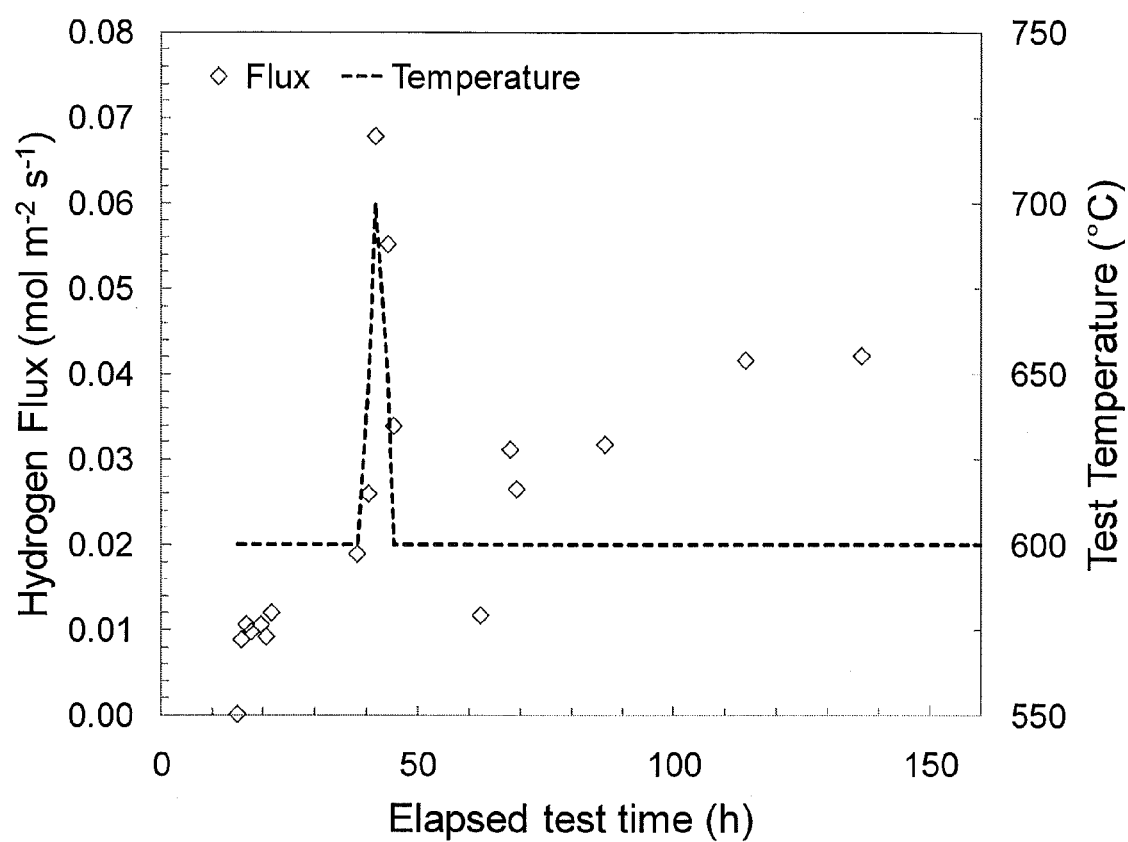
FIG. 8 illustrates effect on hydrogen flux over time.
Figure 9:
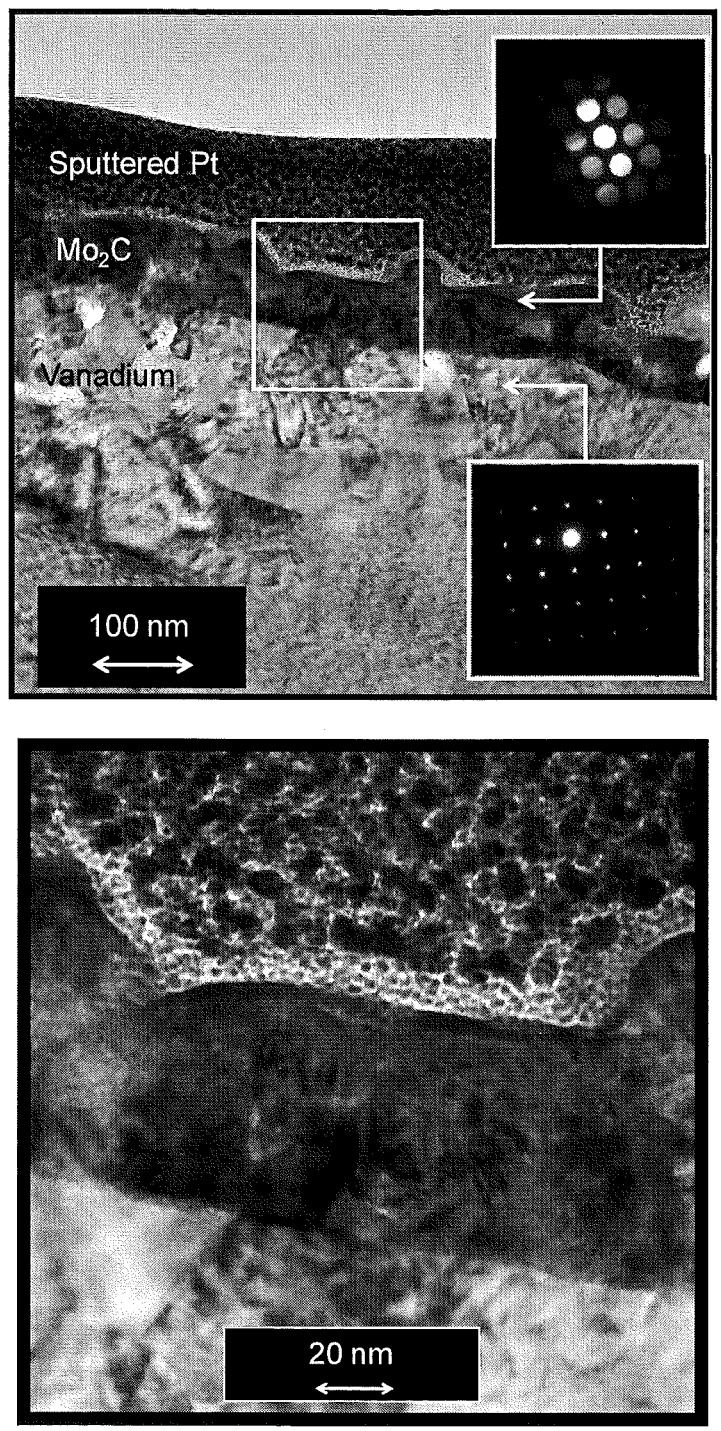
FIG. 9 illustrates TEM images following hydrogen permeation testing.

A critical issue with BCC membranes is the temperature stability of the catalyst layer. A vanadium foil coated with $Mo_2C$ membrane was tested for over 160 hours at elevated temperature (≥about 600° C.) and showed no loss of hydrogen permeability as shown in FIG. 8. In fact, the hydrogen flux may actually improve slightly with time when held at high temperature. By comparison, a palladium-coated vanadium membrane would be expected to lose 50% of its hydrogen permeability within 90 minutes of exposure to hydrogen at about 700° C. This indicates that the carbide catalyst is not reduced to metallic molybdenum which would be expected to alloy with the bulk vanadium. FIG. 9 displays a cross-section transmission electron microscopy (TEM) image of a membrane after permeation testing. This particular carbide layer was deposited at 600° C. The interface between the carbide layer and vanadium remains very sharp after extensive testing at elevated temperatures. The composition and structure of these layers were further interrogated using selected area diffraction (SAD), convergent beam electron diffraction (CBED), and energy dispersive spectroscopy (EDS). The carbide layer is on the order of approximately 65 nm thick, and appears to be quite dense. The inset at the upper right of FIG. 9a is the CBED image taken with the electron beam focused at the center the carbide layer. The regular array reflects the crystallinity of this phase, and indexing of the reflections confirms that it is the orthorhombic phase of molybdenum carbide, consistent with the XRD pattern obtained from the as-deposited layer as shown in FIG. 6. There is significant roughness in this layer with individual features on the order of about 10 nm, again consistent with the morphology observed by AFM in the as-deposited layers as shown in FIG. 7. The presence of grain boundaries are apparent in the high resolution image in FIG. 9b, supporting their important role in hydrogen transport. FIG. 9a shows a 275,000× magnification cross-sectional TEM image of the vanadium foil coated with $Mo_2C$. Insets in FIG. 9a shows selected area and convergent beam diffraction images obtained from the vanadium and carbide layers respectively. FIG. 9b shows a detailed view of the boxed segment of FIG. 9a at 1,000,000× magnification. Note that platinum was deposited after testing as part of sample preparation using a focused ion beam.

The SAD pattern obtained from the vanadium region displays the expected cubic structure, and the extracted d-spacing confirms that it is the BCC phase. There is a notable difference in morphology in the vanadium layer directly adjacent to the carbide layer, and the material far from the interface. The interface region appears to have undergone some form of recrystallization. This is not a result of TEM sample preparation. This may be due to damage resulting from the Ar ion bombardment treatment used to remove the native oxide.

Example 6

Figure 10:
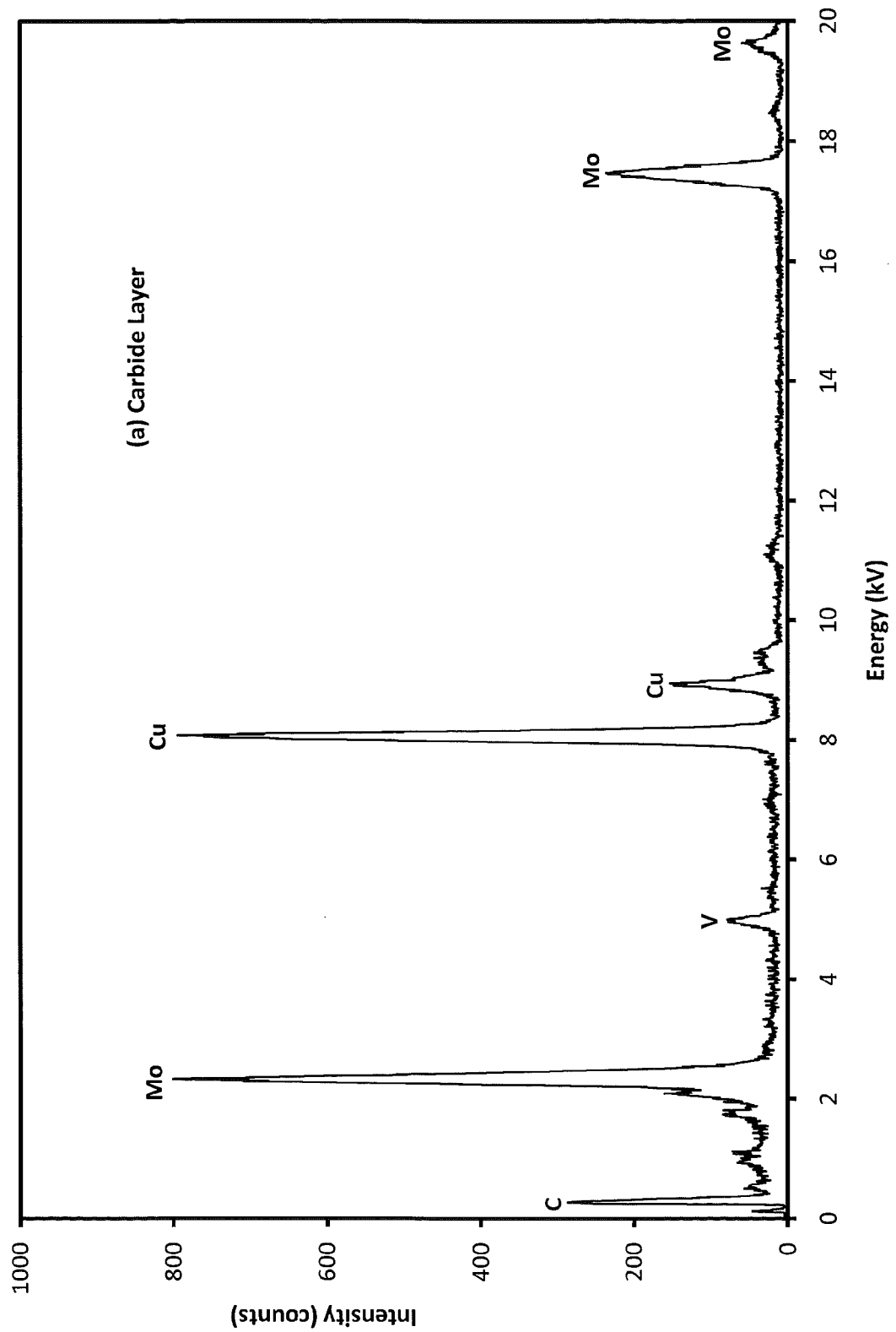
FIG. 10 illustrates energy dispersive spectroscopy results at various locations.
Figure 10:
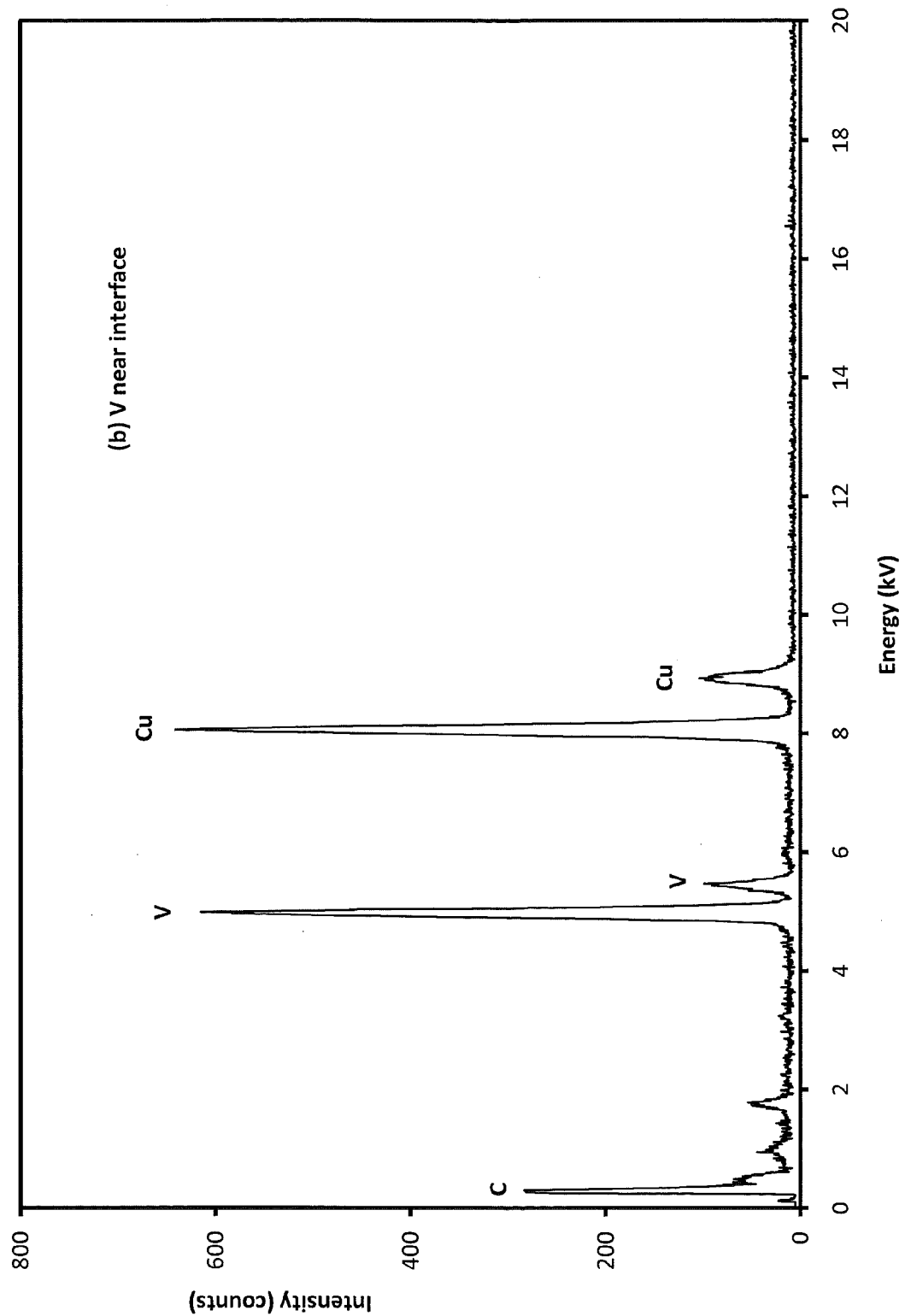
Figure 10:
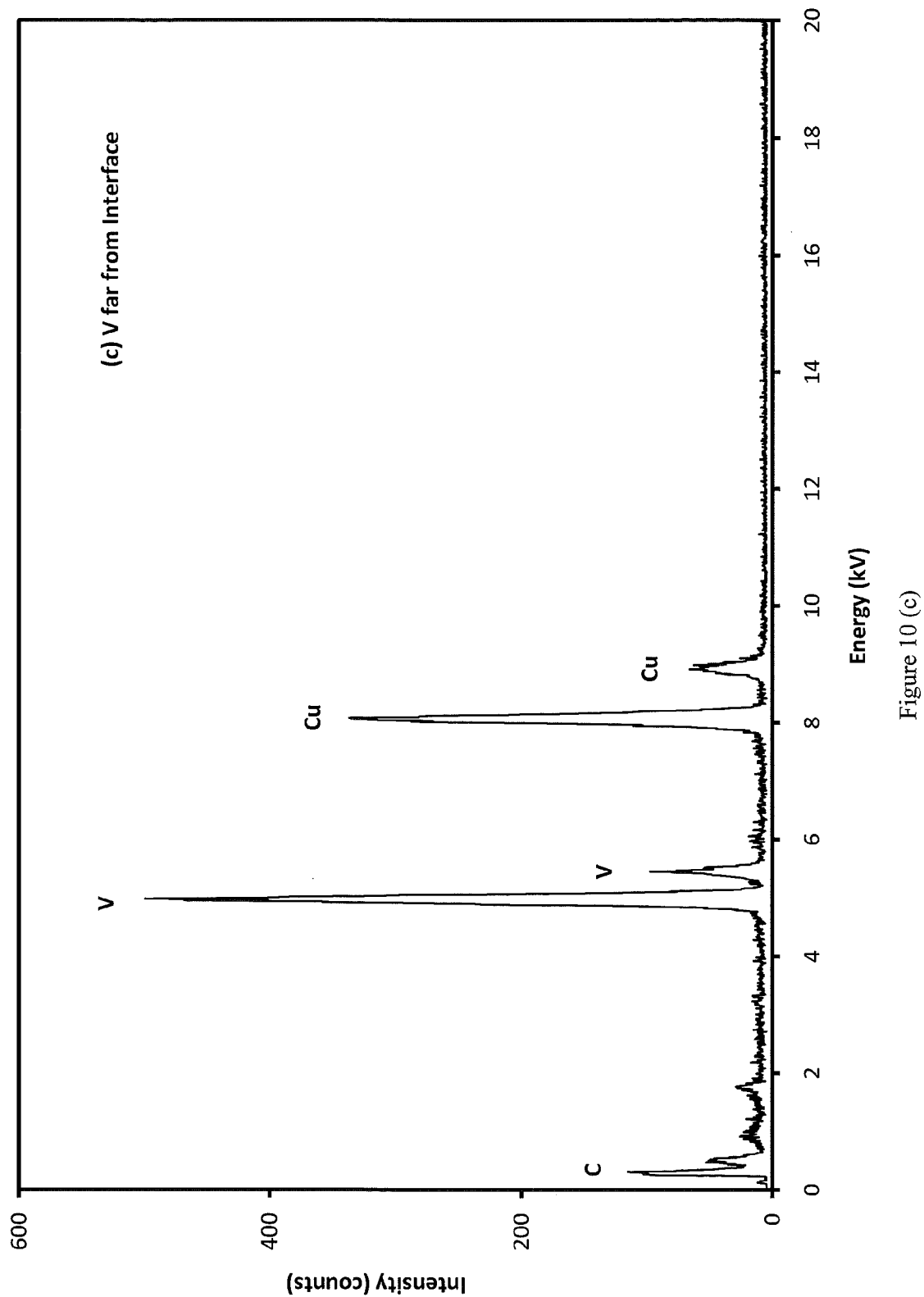

Energy dispersive spectroscopy (EDS) was used to examine the composition at various positions in the vanadium-$Mo_2C$ sample. The EDS spectrum shown in FIG. 10 obtained with the electron beam focused on the carbide layer showed mostly molybdenum as well as small amounts of both vanadium and platinum, which reflects the spatial resolution of the instrument. FIG. 10a illustrates a spectrum from the molybdenum carbide layer, FIG. 10b illustrates a spectrum from the vanadium layer near the carbide layer and FIG. 10c illustrates the vanadium layer far from the interface. Note that in FIGS. 10a-10c, the Cu signal derives from the sample holder. In addition the weak peak at ~1.8 kV labeled W is likely not tungsten, as none of the high energy peaks associated with tungsten are present. This energy level also corresponds to Si, and being present at the same intensity in each spectrum it is attributed to background contamination in the system. The EDS spectrum obtained from the position of the vanadium SAD pattern displayed no molybdenum and contained only peaks associated with V, and was identical to spectra obtained from bulk vanadium taken far from the carbide interface as shown in FIG. 10b and FIG. 10c. These nanoscale characterization techniques provide further confirmation that negligible interdiffusion occurs between these two materials under these conditions.

The maximum hydrogen flux demonstrated to date in this study is already at 30% of the U.S. Department of Energy 2015 goal, while meeting requirements with respect to selectivity. As discussed above, further improvement in the structure of the catalyst is expected to increase the overall permeability of hydrogen in these systems. Through further improvements to the catalyst layer, optimization of the bulk BCC metal's transport properties, and/or reducing the overall membrane thickness, it is expected that this material system will produce highly competitive, cost-effective membranes for high temperature hydrogen separation.

Example 7

Cold-rolled vanadium foils 50.8 micron in thickness with 99.8-99.9% purity were purchased from ESPI Metals and cut into circular samples, each 1.19 cm in diameter. As received vanadium foils contain a layer of native oxide, which hinders hydrogen transport. This layer was removed by an Ar ion sputter treatment at a pressure of 25 millitorr and 100 watts for five minutes at room temperature, which produced a DC bias voltage of 300±1 volts on the substrate. The foils were then heated to their respective sputtering temperatures under vacuum. $Mo_2C$ catalyst layers were deposited directly onto the clean vanadium surface without breaking vacuum by RF sputtering (AJA Orion) in Ar at 5 mtorr using 100 W of power. All films were deposited for 30 minutes, producing films ~65 nm in thickness. The cleaning and sputtering process was performed on both sides of the foil to facilitate dissociation upstream and recombination downstream. Carbide was simultaneously deposited onto vanadium foils and silicon wafers, and the latter were used to facilitate XRD and AFM characterization.

XRD (Siemens Kristalloflex 810) was performed using a Cu Kα radiation, and films were scanned over a range of 2θ=15-65° using a step size of 0.05°. AFM (Digital Instruments Nanoscope III) images were obtained in tapping mode. TEM sample preparation employed the focused ion beam capabilities of a field emission scanning electron microscope (FESEM, FEI Quanta 3D FEG Dual Beam), while imaging was conducted on a FEI Tecnai T20 TEM. Selected area diffraction studies and energy dispersive spectroscopy were performed using a Philips CM200 TEM.

Membranes were permeation tested by mounting in ½" Swagelok™ VCR fittings. The gaskets used were silver-plated nickel to provide a leak-free seal at the elevated temperatures studied while reducing possibility of hydrogen transport through the seals. This created an effective membrane surface area of 0.93 $cm^2$. A filter gasket with a nominal particle rejection size of 10 microns was placed on the permeate side of the membrane to prevent excessive mechanical distortion of the thin foil under high feed-side pressures while providing negligible resistance to flow. The test fixture was mounted in a furnace, and heated under the flow of ultra high purity (UHP) He at 1° C./minute to the base test temperature of 600° C. This prevents low-temperature hydrogen embrittlement of the vanadium bulk, while protecting against destructive oxidation. The membrane was then characterized by single-gas permeation experiments using industrial-grade hydrogen and UHP helium as described in Table 2. The permeate side of the membrane was maintained at atmospheric pressure, locally approximately 82 kPa, and no sweep gases were used during permeation testing. Permeate flows were measured using a soap film meter.

TABLE 2

Order and conditions of experiments

| Experiment | Elapsed time (hours) | Temperature (° C.) | Feed pressure (gauge, kPa) |
|---|---|---|---|
| Flux stabilization | 0-40 | 600 | 138 |
| Thermal cycling | 40-48 | 600-700 | 138-690 |
| Stability testing | 48-168 | 600 | 690 |

For clarity, the following is a list of components and the associated numbering used in the drawings.

| # | Components |
|---|---|
| 100 | Coated membrane |
| 108 | Porous stainless steel substrate |
| 112 | Porous zirconia layer |
| 116, 212, 228 | Catalyst layer |
| 124, 204 | Hydrogen gas |
| 128 | Mixture |
| 200 | Catalyst composite membrane |

-continued

| # | Components |
|---|---|
| 208 | Atomic hydrogen |
| 216 | Substrate |
| 224, 232 | Porous layer |

While an effort has been made to describe various alternatives to the preferred embodiment, other alternatives will readily come to mind to those skilled in the art. Therefore, it should be understood that the invention may be embodied in other specific forms without departing from the spirit or central characteristics thereof. Present examples and embodiments, therefore, are not to be considered in all respects as illustrative and not restrictive, and the invention is not intended to be limited to the details given herein.

What is claimed is:

1. A method for making a hydrogen separation membrane, comprising:
    providing a inorganic substrate;
        applying at least one transition metal catalyst layer to said inorganic substrate, wherein the hydrogen separation membrane does not include a platinum metal group material; and
        determining if a repair of said inorganic substrate is necessary by performing a permeation test with an inert gas.

2. The method of claim 1, wherein said inorganic substrate is selected from the group consisting of an inorganic porous substrate and a body center cubic dense metal substrate.

3. The method of claim 2, wherein said inorganic substrate is said body centered cubic dense metal substrate and wherein said body centered cubic dense metal substrate is selected from the group consisting of vanadium, tantalum, niobium, combinations thereof and alloys thereof.

4. The method of claim 1, wherein said transition metal catalyst layer is selected from the group consisting of a transition metal carbide, a transition metal nitride, a transition metal sulfide and combinations thereof.

5. The method of claim 1, wherein said transition metal catalyst layer comprises a transition metal selected from the group consisting of a molybdenum, tungsten and combinations thereof.

6. The method of claim 1, wherein said transition metal catalyst layer is applied at a temperature between about room temperature and about 600° C.

7. The method of claim 1, further comprising coating said substrate with a polymer material to repair oversized pores on a top surface of said inorganic substrate.

8. The method of claim 1, further comprising a porous layer, wherein said porous layer is a material selected from the group consisting of an alumina, a silica, a zirconia, a ceria, a titania and combinations thereof.

9. The method of claim 1, wherein the at least one transition metal catalyst layer is applied by a vapor deposition method.

10. The method of claim 9, wherein the vapor deposition method is selected from the group consisting of sputtering, chemical deposition and plasma enhanced chemical vapor deposition.

11. The method of claim 2, wherein said inorganic substrate is said body centered cubic dense metal substrate and wherein a thin film of said body centered cubic dense metal substrate is deposited on a porous support layer.

12. The method of claim 1, wherein the at least one transition metal catalyst layer is applied by solution deposition.

13. A method for applying a transition metal catalyst layer to an inorganic substrate to form a hydrogen permeable membrane, comprising:
    providing an inorganic substrate;
    applying a transition metal precursor to said inorganic substrate, wherein the transition metal precursor is a Group VI transition metal selected from the group consisting of molybdenum, tungsten and alloys thereof; and
    converting said transition metal precursor to a transition metal catalyst layer, wherein the hydrogen permeable membrane does not contain a platinum metal group material, and wherein a thickness of the transition metal catalyst layer is between about 2 nanometers to about 50 nanometers.

14. The method of claim 13, further comprising determining if a repair of said substrate is necessary by performing a permeation test with an inert gas.

15. The method of claim 13, further comprising coating said substrate with a polymer material to repair oversized pores on a top surface of said substrate.

16. The method of claim 15, wherein said polymer material is removed by oxidizing said substrate in air having a temperature of at least about 400° C.

17. The method of claim 13, further comprising coating said substrate with an inorganic material to repair oversized pores on a top surface of said substrate.

18. The method of claim 13, wherein a top surface of said substrate is a porous oxide coating.

19. The method of claim 18, wherein said porous oxide coating is selected from the group consisting of an alumina, a silica, a zirconia, a ceria, and a titania.

20. The method of claim 13, wherein said metal precursor is selected from the group consisting of a $WF_6$, a $MoF_6$, a $W(CO)_6$, a $Mo(CO)_6$ and a $MoCl_5$.

21. A hydrogen separation membrane comprising,
    an inorganic substrate, wherein said inorganic substrate is selected from the group consisting of a porous inorganic substrate and a body centered cubic metal substrate; and
    a transition metal catalyst layer deposited on two sides at a thickness of between about 2 nanometers to about 50 nanometers of said inorganic substrate, where the transition metal is a Group VI transition metal selected from the group consisting of molybdenum, tungsten and alloys thereof.

22. The hydrogen separation membrane of claim 21, wherein said inorganic substrate is said porous inorganic substrate, wherein said porous inorganic substrate is a stainless steel material.

23. The hydrogen separation membrane of claim 22, wherein said stainless steel material is coated with a porous oxide coating is selected from the group consisting of an alumina, a silica, a zirconia, a ceria, and a titania.

24. The hydrogen separation membrane of claim 21, wherein said Group VI transition metal is selected from the group consisting of a molybdenum and a tungsten.

25. The hydrogen separation membrane of claim 21, wherein said body centered cubic dense metal substrate is a foil.

26. The hydrogen separation membrane of claim 21, wherein said transition metal catalyst is a transition metal sulfide.

27. The hydrogen separation membrane of claim 21, wherein said transition metal catalyst is a transition metal nitride.

28. The hydrogen separation membrane of claim 21, wherein said transition metal catalyst is a transition metal carbide.

\* \* \* \* \*